(12) United States Patent
Krishnamoorthy

(10) Patent No.: US 6,581,192 B1
(45) Date of Patent: Jun. 17, 2003

(54) METHOD AND SYSTEM FOR PROVIDING A HEURISTIC APPROACH FOR TESTING CELL LIBRARIES

(75) Inventor: Suresh Krishnamoorthy, Sunnyvale, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 0 days.

(21) Appl. No.: 09/872,065

(22) Filed: May 31, 2001

(51) Int. Cl.[7] .............................................. G06F 17/50
(52) U.S. Cl. ........................ 716/4; 716/2; 716/6; 716/11
(58) Field of Search ................................ 364/488, 489; 716/2, 4, 6, 11

(56) References Cited

U.S. PATENT DOCUMENTS

| | | | | | |
|---|---|---|---|---|---|
| 5,406,497 A | * | 4/1995 | Altheimer et al. | ............ | 716/6 |
| 5,838,579 A | * | 11/1998 | Olson et al. | ............ | 716/2 |
| 6,035,111 A | * | 3/2000 | Suzuki et al. | ............ | 716/11 |
| 6,260,177 B1 | * | 7/2001 | Lee et al. | ............ | 716/2 |
| 6,374,395 B1 | * | 4/2002 | Wang | ............ | 716/11 |

* cited by examiner

Primary Examiner—David Nelms
Assistant Examiner—Dao H. Nguyen
(74) Attorney, Agent, or Firm—Martine & Penilla, LLP

(57) ABSTRACT

Method and system for testing building blocks or cells stored in cell libraries used in digital design including generating a test design configuration of rows and columns of cells of the particular cell library and interconnecting each pin of each cell in the test design for isolating and correcting faulty cells in the cell library such that error check at the cell level and simultaneously checking errors in the cell library is provided.

44 Claims, 3 Drawing Sheets

METHOD AND SYSTEM FOR PROVIDING A HEURISTIC APPROACH FOR TESTING CELL LIBRARIES

BACKGROUND OF THE INVENTION

1. Field of the Invention

The present invention relates to digital circuit design. More particularly, the present invention relates to method and system for providing a heuristic approach to testing the building blocks or cells for digital circuit design using cell libraries.

2. Description of the Related Art

In digital design, there are basic building blocks referred to as cells which include logic gates such as, for example, AND gates, OR gates, multiplexers and so on, which are placed in cell libraries. For each cell stored in the cell library, the corresponding functionalities for the building block, pin names, pin positions, as well as information related to compatibility with other cells is stored. While the cells are generally configured for their respective intended operation when tested individually, it is often the case that when the cells are combined in a design implementation, the functionality of the cells may not be obtained as intended.

It is possible to test the individual cells separately such that to identify faulty cells or design defects. However, given that design layouts generally use a large number of cells for its implementation, it is often very time consuming to test the cells individually and may be impractical. Moreover, some errors in the cells stored in the cell libraries may not be detected until the final actual layout implementation stage.

SUMMARY OF THE INVENTION

In view of the foregoing, a method of testing a cell library in accordance with one embodiment of the present invention includes retrieving a plurality of cells stored in a cell library, generating a cell matrix including the retrieved plurality of cells, connecting each of the plurality of cells in the cell matrix, and performing connection verification of each connection of the connecting step.

The retrieved plurality of cells may include all stored cells in the cell library.

The generating step may further include retrieving a rule set for the cell matrix, and generating one or more columns of retrieved cells and one or more rows of retrieved cells based on the rule set.

The retrieved rule set may include one or more of information corresponding to a number of allowable cells in a generated row, and information corresponding to the type of retrieved cells for the generated row.

Each of the retrieved plurality of cells may include at least one input port and one output port, and the connecting step connecting each input and output ports of each of the plurality of cells.

The step of performing connection verification may include detecting an error corresponding to one or more of the plurality of cells in the connecting step, and correcting the detected error corresponding to the one or more of the plurality of cells in the cell library.

The detected error may include one of a pin name error corresponding to the one or more of the plurality of cells, a layout scaling error corresponding to the one or more of the plurality of cells, and a timing error corresponding to the one or more of the plurality of cells, and a size error corresponding to a physical size of the one or more of the plurality of cells.

The method may further include the step of updating the cell library based on the connection verification performing step, where the updating step may include the step of storing information corresponding to one or more of the plurality of cells in the cell library.

Additionally, the method may further include implementing a physical layout of a design based on the cell library, performing an error check of the physical layout, where the error check performing step may include the step of executing an electrical rules checker.

The plurality of cells may include one or more of an AND gate cell, an OR gate cell, and exclusive-OR gate cell, and exclusive-NOR gate cell, a flip-flop cell, a multiplexer cell, an adder cell, and a subtractor cell.

Alternatively, the plurality of cells may include one or more of a simple combinational cell and a complex combinational cell.

A method of testing a cell library in accordance with another embodiment of the present invention includes retrieving each cell stored in a cell library, generating a cell matrix including the retrieved cells, connecting each retrieved cell in the cell matrix, detecting an error corresponding to one or more of the retrieved cells in the connecting step, and correcting the detected error corresponding to the one or more of the retrieved cells.

A system for testing a cell library in accordance with yet another embodiment of the present invention includes means for retrieving a plurality of cells stored in a cell library, means for generating a cell matrix including the retrieved plurality of cells, means for connecting each of the plurality of cells in the cell matrix, means for performing connection verification of each connection of the connecting step.

The generating means may include means for retrieving a rule set for the cell matrix, and means for generating one or more columns of retrieved cells and one or more rows of retrieved cells based on the rule set.

Moreover, each of the retrieved plurality of cells may include at least one input port and one output port, and the connecting means configured to connect each input and output ports of each of the plurality of cells.

The means for performing connection verification may include means for detecting an error corresponding to one or more of the plurality of cell, and means for correcting the detected error corresponding to the one or more of the plurality of cells in the cell library.

The system may further include means for updating the cell library based on the connection verification, where the updating means may additionally include storing means for storing information corresponding to one or more of the plurality of cells in the cell library.

Further, in one aspect, the system may also include means for implementing a physical layout of a design based on the cell library, and means for performing an error check of the physical layout. Additionally, the error check performing means may include means for executing an electrical rules checker.

A system for testing a cell library in accordance with still another embodiment of the present invention includes means for retrieving each cell stored in a cell library, means for generating a cell matrix including the retrieved cells, means for connecting each retrieved cell in the cell matrix, means for detecting an error in one or more of the connections, and means for correcting the detected error corresponding to the one or more of the retrieved cells.

In the manner described above, in accordance with the various embodiments of the present invention, a column and row configuration schematic of a test design using all the cells in a given cell library may be generated. In particular, the cells may be classified into different types such as simple combinational cells, complex combinational cells, multiplexers, flip flops, AND gates, OR gates, exclusive-OR gates and so on. In one aspect, the cells of a similar type may be then placed in a column, and after placing all the cells from the cell library into organized columns, interconnections are made at random between two successive columns in the generated column and row configuration. All of the output pins or ports from a particular column and all the input pins or ports on the subsequent column are used up in this process such that all the pins or ports of the cell in the column and row configuration are connected. The input pins on the first column may then effectively become the primary inputs of the resultant test design and the output pins on the last column become the primary outputs of the test design.

With the generated column and row configuration of the test design, the cells are then placed in the regular design cycle which includes placement, routing and backend design checks. If the test design passes all the error verifications when placed in the regular design cycle, then the cells used in the test design from the cell library may be confirmed as properly functional. In this manner, in one aspect of the present invention, a heuristic approach to verifying the operation and function of individual cells of a cell library at the cell level, and at the same time, checking the function of the cell library itself in a fast and efficient manner may be provided.

These and other features and advantages of the present invention will be understood upon consideration of the following detailed description of the invention and the accompanying drawings.

DESCRIPTION OF THE PREFERRED EMBODIMENT

Figure 1:
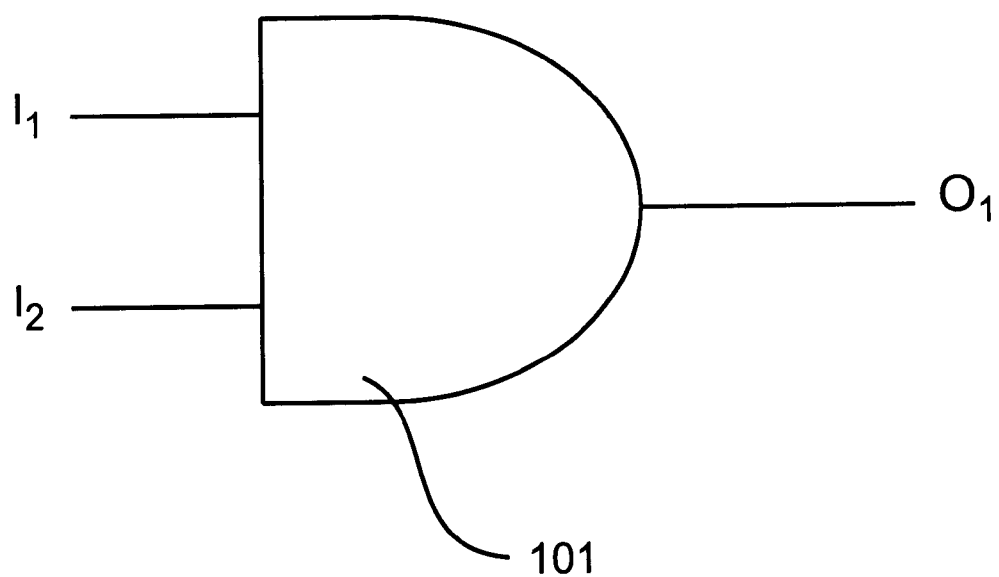
FIG. 1 illustrates a schematic view of an exemplary cell of a cell library for use with one embodiment of the present invention.

FIG. 1 illustrates a schematic view of an exemplary cell of a cell library for use with one embodiment of the present invention. Referring to FIG. 1, an AND gate cell of a cell library is shown. In particular, it can be seen from FIG. 1 that the AND gate cell 101 includes two inputs I1 and I2 and a corresponding output O1. The particular functionality of the AND gate cell 101 may be stored in a corresponding cell library along with information corresponding to other cells.

In particular, the cell library may include information corresponding to the input and output ports for each stored cell, the functional relationship of the input and output ports of the stored cells, timing information of the inputs and outputs of the cells, the layout and schematic of each stored cell as well as the corresponding symbols for the stored cells. For example, for the AND gate cell 101 shown in FIG. 1, the corresponding cell library may have stored therein corresponding port names for the inputs I1 and I2 as well as the output O1. Moreover, the cell library may further store the functional relationship of the two inputs I1, I2 relative to the output O1 corresponding to the AND gate cell 101, such as output O1 equals input I1 and input I2.

Further stored in the cell library for the AND gate cell 101 is timing information for the inputs I1, I2 relative to the output O1 such as time delay (for example, measured in nanoseconds) for the signals received at the inputs I1, I2 to be propagated to the output O1 when the output O1 is rising and falling. Additionally, whether the output O1 is inverting or non-inverting may be stored in the cell library corresponding to the AND gate cell 101. Layout information corresponding to the AND gate cell 101 as well as for other cells stored in the cell library include the geometric information of each cell defined, for example, as a function of coordinates and so on. The schematic stored in the cell library for each cell may include the actual transistor level implementation of the corresponding cell, while the symbol information for the cells in the cell library may include a graphical representation of the corresponding cells for use in high level designs.

In the manner described above, each cell library, such as a standard cell library discussed above or a data path library which may have different building rules compared to the standard cell libraries, may be configured to store information corresponding to each cell in the library which may be retrieved and updated during the design stage. Furthermore, while an AND gate cell 101 is illustrated in FIG. 1, cell libraries discussed above may include other types of cells such as an OR gate cell, an exclusive-OR gate cell, a multiplexer cell, an adder cell, a flip-flop cell and so on. Moreover, the cell libraries may be configured to store several hundred different types of cells for use in the design stage.

Figure 2:
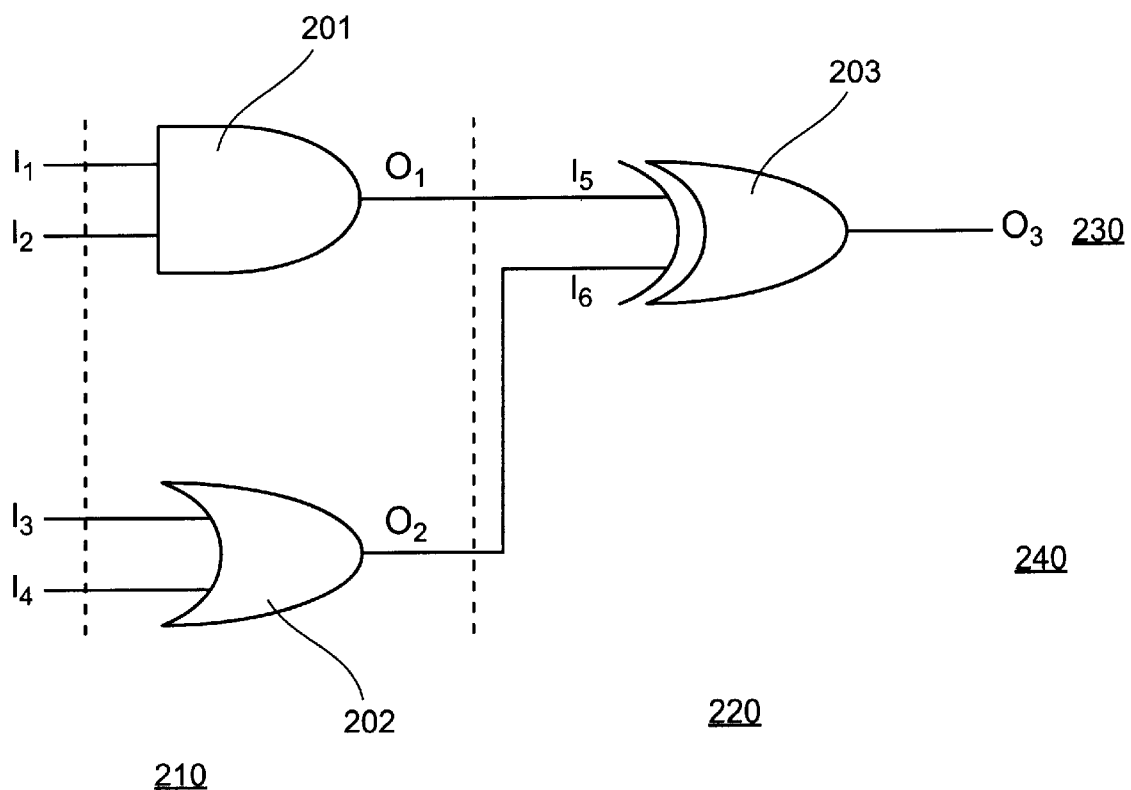
FIG. 2 illustrates column and row generation of the cells stored in a cell library in accordance with one embodiment of the present invention.

FIG. 2 illustrates column and row generation of the cells stored in a cell library in accordance with one embodiment of the present invention. Referring to FIG. 2, two rows 230, 240 and two columns 210, 220 are shown. As will be discussed in further detail below, in one aspect of the present invention, rules for generating the columns and the rows are retrieved based on the cells stored in a particular cell library for which the column and row generation is to be performed. The rules for generating the columns and the rows may include, for example, the types of cells stored in the cell library which may be multiplexed in the same row, and the number of cells to be provided for each row. In this manner, based on the retrieved rules, the manner in which the columns are laid out may be determined for each cell library.

Referring to FIG. 2, row 230 includes an AND gate cell 201 provided in the first column 210 and an exclusive-OR gate cell 203 in the second column 220. Furthermore, an OR gate cell 202 is provided in the second row 240 in the first column 210. In this manner, for all stored cells in a given cell library, each stored cell is laid out in a particular row and column, and when all the columns are generated, the interconnections for each input and output ports of the cells are performed. While only three cells are shown in FIG. 2 with two rows and two columns, in accordance with the various aspects of the present invention, the row and column generation may include the generation of as many rows and columns as necessary to provide for each cell stored in the given cell library.

When all the columns and rows are generated for the particular cell library, interconnections of the respective ports for each cell in the generated column and row configuration is performed. In one aspect, all open ports are connected in the column and row configuration such that there are no floating ports. Moreover, the port interconnection in one embodiment may be performed randomly such that the output port of a cell in a given row may be connected to an input port of a cell in an adjacent column in the same row.

For example, referring to FIG. 2, it can be seen that the output port O1 of the AND gate cell 201 provided in the first column 210 in the first row 230 is connected to the first input port I5 of the exclusive-OR gate cell 203 provided in the second column 220 in the first row 230, while the output port of the OR gate cell 202 provided in the first column 210 second row 240 is connected to the second input port I6 of the exclusive-OR gate cell 203. In this manner, once each port of each cell provided in the column and row configuration is connected for the given cell library, a design check is performed to detect any faulty interconnections.

In one aspect, the faulty interconnections detected during the design check may include erroneous port names of a given cell or cells, out of scale timing for a given cell or cells, cell layout which do not comply with the particular rules related to the specific cells such as size requirements, position of the input ports and output ports relative to the overall design and so on. More specifically, during the design check stage of the column and row configuration, for example, referring to FIG. 2, in the case where the output port O1 of the AND gate cell 201 is not properly connected to the first input port I5 of the exclusive-OR gate cell 203, an error message is returned. Such connection problem may arise, as discussed above, from faulty or erroneous cell configuration.

For example, the first input port I5 of exclusive-OR gate cell 203 stored in the cell library may not be named I5, but rather, P5. In this case, during the interconnection stage, the output port O1 of the AND gate cell 201 cannot be connected to the first input port I5 of the exclusive-OR gate cell 203 since the first input port I5 is not properly named in the cell library. Alternatively, the layout information for the exclusive-OR gate cell 203 stored in the cell library may be such that the exclusive-OR gate cell 203 may be of a different size, which, in turn, translates to an improper scaling of the two input ports I5,I6 and the output port O3. In this case, during the interconnection stage, the output port O1 of the AND gate cell 201 may not be able to connect to the first input port I5 of the exclusive-OR gate cell 203 due to erroneous coordinate information corresponding to the first input port I5 of the exclusive-OR gate cell 203 stored in the cell library.

In the manner described above, in the event that a faulty connection is detected during the design check stage of the column and row configuration of the cells of the given cell library, in accordance with one aspect of the present invention, the faulty cell connection may be easily isolated and corrected by, for example, resizing the cell itself such that proper layout information may be stored in the cell library, or renaming the erroneously named port for a given cell and storing the proper port name in the cell library. In this manner, in accordance with one embodiment, it is possible to isolate and correct the physical position information of a cell stored in the cell library as well as the scale of the cell layout, cell pin location, and the assigned port names for each stored cell in the cell library before the actual implementation for a given design is performed.

Figure 3:
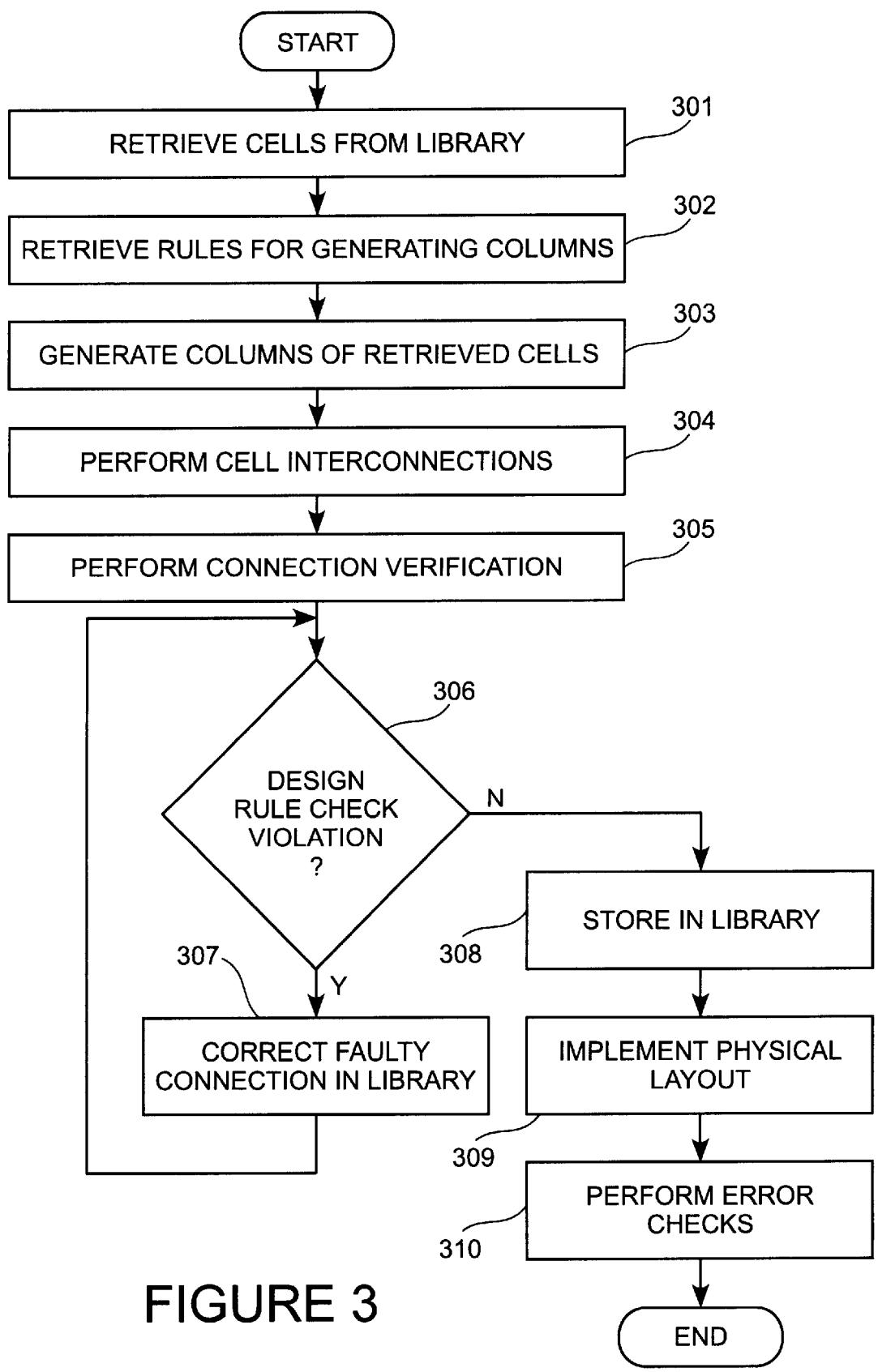
FIG. 3 illustrates a flowchart illustrating a testing procedure for a cell library in accordance with one embodiment of the present invention.

FIG. 3 illustrates a flowchart illustrating a testing procedure for a cell library in accordance with one embodiment of the present invention. Referring to FIG. 3, at step 301, all cells stored in a particular cell library is retrieved including the number of cells in the cell library as well as the types of each cell stored in the cell library. Thereafter, the rules for generating the column and row configuration for the testing procedure is retrieved. As discussed above, the retrieved rules may include, for example, the types of cells that may be provided in a given row of the column and row configuration, as well as the number of cells to be provided in each row of the column and row configuration.

With the retrieved cells from the cell library a column and row configuration is generated at step 303 based on the retrieved rules at step 302.

Thereafter, with all the cells retrieved from the cell library retrieved and laid out in the column and row configuration, each input and output ports of the laid out cells in the column and row configuration is connected at step 304 such that all the available ports are interconnected. In one embodiment, as discussed above, the ports of the laid out cells may be interconnected randomly such that the output ports of the cells in a given column are respectively connected to the input ports of the subsequent adjacent column irrespective of the type of cells being connected to each other.

Referring back to FIG. 3, at step 305 the interconnection of cells in the column and row configuration verification is performed and at step 306 it is determined whether there exists any design rule check violations in the cell interconnections of the column and row configuration. In the case where design rule check violations exist in the interconnection of the cells, at step 307, the isolated faulty interconnection is corrected and the corrected information is stored in the cell library for the corresponding cell. As can be seen from FIG. 3, the design rule check violation step 306 and the correction step 307 may be repeated in one aspect until the design rule check violation step 306 returns a no violation message.

In one aspect, when a faulty interconnection between ports of adjacent cells in a given row in the column and row configuration is detected at step 306 by, for example, an error message returned during the connection verification step 305, the particular cell information including the cell ports for the failed or faulty interconnection may be determined. Having isolated the faulty cell or cells in the cell library, as discussed above, the information corresponding to the faulty cells stored in the cell library is modified to correct for the faulty connection. In one embodiment, in the case of an erroneous port name for a given cell causing the faulty connection, the isolated port name for the particular cell stored in the cell library may be modified to reflect the proper assigned port name. Alternatively, in the case where the faulty interconnection is based on an erroneous scaling of the cell layout, it is possible to retrieve the layout information of the given cell from the cell library and the proper scaling information for the cell layout may be stored in the cell library.

Referring again to FIG. 3, if at step 306 it is determined that there are no design rule check violations, then at step 308, the cell information such as port names, layout, scaling and so on used for generating the column and row configuration is stored in the cell library for each corresponding cell. Thereafter, the actual physical layout implementation of a particular design using the cells in the cell library may be performed and an error check may be performed thereafter at step 310 checking for, for example, ERC (electrical Rules Checker) errors in the physical layout of the design.

In the manner described above, in accordance with the various embodiments of the present invention, a column and row configuration schematic of a test design using all the cells in a given cell library may be generated. In particular, the cells may be classified into different types such as simple combinational cells, complex combinational cells, multiplexers, flip flops, AND gates, OR gates, exclusive-OR gates and so on. In one aspect, the cells of a similar type may be then placed in a column, and after placing all the cells from the cell library into organized columns, interconnections are made at random between two successive columns in the generated column and row configuration. All of the output pins or ports from a particular column and all the input pins or ports on the subsequent column are used up in this process such that all the pins or ports of the cell in the column and row configuration are connected. The input pins on the first column may then effectively become the primary inputs of the resultant test design and the output pins on the last column become the primary outputs of the test design.

With the generated column and row configuration of the test design, the cells are then placed in the regular design cycle which includes placement, routing and backend design checks. If the test design passes all the error verifications when placed in the regular design cycle, then the cells used in the test design from the cell library may be confirmed as properly functional. In this manner, in one aspect of the present invention, a heuristic approach to verifying the operation and function of individual cells of a cell library at the cell level, and at the same time, checking the function of the cell library itself in a fast and efficient manner may be provided.

Various other modifications and alterations in the structure and method of operation of this invention will be apparent to those skilled in the art without departing from the scope and spirit of the invention. Although the invention has been described in connection with specific preferred embodiments, it should be understood that the invention as claimed should not be unduly limited to such specific embodiments. It is intended that the following claims define the scope of the present invention and that structures and methods within the scope of these claims and their equivalents be covered thereby.

What is claimed is:

1. A method for testing a cell library, comprising the steps of:
   retrieving a plurality of cells stored in a library;
   generating a cell matrix including the retrieved plurality of cells;
   connecting each of the plurality of cells in the cell matrix; and
   performing a connection verification of each connection of the connection step between said plurality of cells;
   detecting an error in a connection between said plurality of cells; and
   correcting said error in said connection.

2. The method of claim 1 wherein said retrieved plurality of cells include all stored cells in the cell library.

3. The method of claim 1 wherein said generating step includes the steps of:
   retrieving a rule set for said cell matrix; and
   generating one or more columns of retrieved cells and one or more rows of retrieved cells based on said rule set.

4. The method of claim 3 wherein said retrieved rule set includes one or more of information corresponding to a number of allowable cells in a generated row, and information corresponding to the type of retrieved cells for said generated row.

5. The method of claim 1 wherein each of said retrieved plurality of cells include at least one input port and one output port, and said connecting step connecting each input and output ports of each of said plurality of cells.

6. The method of claim 1 wherein said detected error may include one of a pin name error corresponding to said one or more of said plurality of cells, a layout scaling error corresponding to said one or more of said plurality of cells, and a timing error corresponding to said one or more of said plurality of cells, and a size error corresponding to a physical size of said one or more of said plurality of cells.

7. The method of claim 1 further including the step of updating said cell library based on said connection verification performing step.

8. The method of claim 7 wherein said updating step includes the step of storing information corresponding to one or more of said plurality of cells in said cell library.

9. The method of claim 1 further including the steps of:
   implementing a physical layout of a design based on said cell library; and
   performing an error check of said physical layout.

10. The method of claim 9 wherein said error check performing step includes the step of executing an electrical rules checker.

11. The method of claim 1 wherein said plurality of cells include one or more of an AND gate cell, an OR gate cell, and exclusive-OR gate cell, and exclusive-NOR gate cell, a flip-flop cell, a multiplexer cell, an adder cell, and a subtractor cell.

12. The method of claim 1 wherein said plurality of cells may include one or more of a simple combinational cell and a complex combinational cell.

13. A method of testing a cell library, comprising the steps of:
   retrieving each cell stored in a cell library;
   generating a cell matrix including the retrieved cells;
   connecting each retrieved cell in the cell matrix;
   detecting an error corresponding to one or more of the retrieved cells in said connecting step; and
   correcting said detected error corresponding to said one or more of said retrieved cells.

14. The method of claim 13 wherein said generating step includes the steps of:
   retrieving a rule set for said cell matrix; and
   generating one or more columns of said retrieved cells and one or more rows of said retrieved cells based on said rule set.

15. The method of claim 14 wherein said retrieved rule set includes one or more of information corresponding to a number of allowable cells in a generated row, and information corresponding to the type of retrieved cells for said generated row.

16. The method of claim 13 wherein each of said retrieved cells include at least one input port and one output port, and said connecting step connecting each input and output ports of each of said retrieved cells.

17. The method of claim 13 wherein said detected error includes one of a pin name error corresponding to said one or more of said plurality of cells, a layout scaling error corresponding to said one or more of said plurality of cells, and a timing error corresponding to said one or more of said plurality of cells, and a size error corresponding to a physical size of said one or more of said plurality of cells.

18. The method of claim 13 further including the step of updating said cell library based on said correcting step.

19. The method of claim 18 wherein said updating step includes the step of storing information corresponding to one or more of said retrieved cells in said cell library.

20. The method of claim 13 further including the steps of:
implementing a physical layout of a design based on said cell library; and
performing an error check of said physical layout.

21. The method of claim 20 wherein said error check performing step includes the step of executing an electrical rules checker.

22. The method of claim 13 wherein said retrieved cells may include one or more of a simple combinational cell and a complex combinational cell.

23. A system for testing a cell library, comprising the steps of:
means for retrieving a plurality of cells stored in a library;
means for generating a cell matrix including the retrieved plurality of cells;
means for connecting each of the plurality of cells in the cell matrix; and
means for performing a connection verification of each connection of the connection step between said plurality of cells;
means for detecting an error in a connection between said plurality of cells; and
means for correcting said error in said connection.

24. The system of claim 23 wherein said retrieved plurality of cells include all stored cells in the cell library.

25. The system of claim 23 wherein said generating means includes:
means for retrieving a rule set for said cell matrix; and
means for generating one or more columns of retrieved cells and one or more rows of retrieved cells based on said rule set.

26. The system of claim 25 wherein said retrieved rule set includes one or more of information corresponding to a number of allowable cells in a generated row, and information corresponding to the type of retrieved cells for said generated row.

27. The system of claim 23 wherein each of said retrieved plurality of cells include at least one input port and one output port, and said connecting means configured to connect each input and output ports of each of said plurality of cells.

28. The system of claim 23 wherein said detected error may include one of a pin name error corresponding to said one or more of said plurality of cells, a layout scaling error corresponding to said one or more of said plurality of cells, and a timing error corresponding to said one or more of said plurality of cells, and a size error corresponding to a physical size of said one or more of said plurality of cells.

29. The system of claim 23 further including means for updating said cell library based on said connection verification.

30. The system of claim 29 wherein said updating means includes storing means for storing information corresponding to one or more of said plurality of cells in said cell library.

31. The system, of claim 23 further including:
means for implementing a physical layout of a design based on said cell library; and
means for performing an error check of said physical layout.

32. The system of claim 31 wherein said error check performing means includes means for executing an electrical rules checker.

33. The system of claim 23 wherein said plurality of cells include one or more of an AND gate cell, an OR gate cell, and exclusive-OR gate cell, and exclusive-NOR gate cell, a flip-flop cell, a multiplexer cell, an adder cell, and a subtractor cell.

34. The system of claim 23 wherein said plurality of cells may include one or more of a simple combinational cell and a complex Combinational cell.

35. A system for testing a cell library, comprising:
means for retrieving each cell stored in a cell library;
means for generating a cell matrix including the retrieved cells;
means for connecting each retrieved cell in the cell matrix;
means for detecting an error in one or more of said connections; and
means for correcting said detected error corresponding to said one or more of said retrieved cells.

36. The system of claim 35 wherein said generating means includes:
means for retrieving a rule set for said cell matrix; and
means for generating one or more columns of said retrieved cells and one or more rows of said retrieved cells based on said rule set.

37. The system of claim 36 wherein said retrieved rule set includes one or more of information corresponding to a number of allowable cells in a generated row, and information corresponding to the type of retrieved cells for said generated row.

38. The system of claim 35 wherein each of said retrieved cells include at least one input port and one output port, and said connecting means configured to connect each input and output ports of each of said retrieved cells.

39. The system of claim 35 wherein said detected error includes one of a pin name error corresponding to said one or more of said plurality of cells, a layout scaling error corresponding to said one or more of said plurality of cells, and a timing error corresponding to said one or more of said plurality of cells, and a size error corresponding to a physical size of said one or more of said plurality of cells.

40. The system of claim 35 further including means for updating said cell library based on said detected error.

41. The system of claim 40 wherein said updating means includes the means for storing information corresponding to one or more of said retrieved cells in said cell library.

42. The system of claim 35 further including:
means for implementing a physical layout of a design based on said cell library; and
means for performing an error check of said physical layout.

43. The system of claim 42 wherein said error check performing means includes means for executing an electrical rules checker.

44. The system of claim 35 wherein said retrieved cells may include one or more of a simple combinational cell and a complex combinational cell.

* * * * *